United States Patent
Chun

(10) Patent No.: US 7,482,692 B2
(45) Date of Patent: Jan. 27, 2009

(54) TUNGSTEN PLUG STRUCTURE OF SEMICONDUCTOR DEVICE AND METHOD FOR FORMING THE SAME

(75) Inventor: In Kyu Chun, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/320,698

(22) Filed: Dec. 30, 2005

(65) Prior Publication Data

US 2007/0102824 A1    May 10, 2007

(30) Foreign Application Priority Data

Oct. 5, 2005    (KR)    .................. 10-2005-0093463

(51) Int. Cl.
   *H01L 23/48*    (2006.01)
(52) U.S. Cl. ........................ 257/758; 257/736; 257/760; 257/774; 257/E21.597
(58) Field of Classification Search ................. 257/315, 257/774, 736, 758, 760
   See application file for complete search history.

(56) References Cited

U.S. PATENT DOCUMENTS

| | | | |
|---|---|---|---|
| 5,986,299 A * | 11/1999 | Nakamura et al. | .......... 257/296 |
| 6,690,053 B2 * | 2/2004 | Amo et al. | .................. 257/306 |
| 2001/0030372 A1 * | 10/2001 | Mori et al. | .................. 257/903 |

* cited by examiner

*Primary Examiner*—Wai-Sing Louie
(74) *Attorney, Agent, or Firm*—Finnegan, Henderson, Farabow, Garrett, & Dunner, L.L.P.

(57) ABSTRACT

A tungsten plug structure of a semiconductor device wherein a method for forming the same is performed at least twice to form a tungsten plug having a low aspect ratio, thereby obtaining an overlap margin between the tungsten plug and a metal line and minimizing contact resistance between the tungsten plug and a lower metal line layer. The plug structure of a semiconductor device includes a silicon substrate in which various elements for the semiconductor device are formed, a first dielectric film formed on the silicon substrate, having a first contact hole, a first plug buried in the first contact hole of the first dielectric film, having a low aspect ratio, a second dielectric film formed on an entire surface including the first dielectric film, having a second contact hole on the first plug, a second plug buried in the second contact hole of the second dielectric film, having a low aspect ratio, and a metal line formed on the second plug.

21 Claims, 8 Drawing Sheets

TUNGSTEN PLUG STRUCTURE OF SEMICONDUCTOR DEVICE AND METHOD FOR FORMING THE SAME

This application claims the benefit of the Korean Patent Application No. P2005-0093463, filed on Oct. 5, 2005, which is hereby incorporated by reference in its entirety.

BACKGROUND

1. Technical Field

The present invention relates to a tungsten plug structure of a semiconductor device and a method for forming the same, and more particularly, to a tungsten plug structure of a semiconductor device and a method for forming the same in which a tungsten plug process is performed at least twice to form a tungsten plug having a low aspect ratio, thereby obtaining an overlap margin between the tungsten plug and a metal line.

2. Discussion of the Related Art

Attention has been focused on a metal line process based on copper to keep up with a semiconductor device of high speed. However, many efforts to use a metal line process based on aluminum are recently being tried considering economical and patterning aspects. Particularly, devices based on the aluminum metal line process in 130 nm technology are coming onto the market.

A method that makes multilevel metal lines and connects the multilevel metal lines in an integrated circuit is widely used as the size of the semiconductor device is gradually reduced. Generally, to connect the metal lines with each other, a contact hole is formed on a lower metal line layer and metal such as aluminum is deposited by sputtering to form an upper metal line layer. Thus, the multilevel metal lines connected with each other through the contact hole are completed.

However, if the metal such as aluminum is deposited by sputtering, the metal is not completely buried in the contact hole. For this reason, the metal lines are not connected with each other and step coverage in the contact hole becomes poor. As a result, problems occur in that contact resistance is increased and reliability is deteriorated.

In this respect, a metal plug based on tungsten having excellent burying characteristics of a contact along with excellent step coverage in a contact hole has been formed to connect the metal lines of the semiconductor device due to high integration of the semiconductor device. Tungsten has excellent step coverage characteristics in a direct contact and excellent burying characteristics in a metal contact.

However, with high integration of the semiconductor device, a design rule becomes strict and thus a sufficient margin in various processes is not obtained. Particularly, an aspect ratio of a tungsten plug is gradually increased and thus an overlap margin between the tungsten plug and the metal line becomes insufficient.

Hereinafter, a related method for forming a tungsten plug of a semiconductor device will be described with reference to the accompanying drawings.

FIG. 1A to FIG. 1D are sectional views illustrating process steps of forming a tungsten plug of a semiconductor device according to the related art, FIG. 2 is a sectional view illustrating a plug structure of a semiconductor device according to the related art, and FIG. 3 to FIG. 5 are sectional views illustrating problems of a plug structure of a semiconductor device according to the related art.

First, as shown in FIG. 1A, a silicon nitride (SiN) film (not shown) is thinly deposited on an entire surface of a silicon substrate 10 including gate electrodes 20 formed on the silicon substrate 10 at a constant interval. Boro phosphorous silicate glass (BPSG) or $SiO_2$ is thickly deposited on the silicon nitride film by a chemical vapor deposition (CVD) process at a thickness of about 6000 Å to 10000 Å and then planarized to form an interlayer dielectric film 30.

Afterwards, as shown in FIG. 1B, the interlayer dielectric film 30 is partially dry etched using the silicon nitride film as an etching stopper to form a contact hole 40. As shown in FIG. 1C, tungsten is deposited on the entire surface by the CVD process and buried in the contact hole to form a tungsten plug 41.

Finally, as shown in FIG. 1D, tungsten is completely removed from the upper surface of interlayer dielectric film 30 by a chemical mechanical polishing (CMP) process to completely expose the interlayer dielectric film 30. Aluminum is then deposited on the entire surface including the tungsten plug 41 by sputtering and then patterned by a photolithographic process to form a metal line 50 that contacts the tungsten plug 41.

However, as shown in FIG. 2, an upper width W1 of the tungsten plug 41 is equal to the lower width W2. As shown in FIG. 3, a sidewall is etched simultaneously when the contact hole 40 is formed by the dry etching process. For this reason, the upper width W1 becomes wider than the lower width W2. As a result, an aspect ratio of the tungsten plug 40 formed by a gap-fill in the contact hole is increased. If the aspect ratio of the contact hole is increased, gap-fill of tungsten is easily made. However, it is difficult to obtain a sufficient margin due to high integration of the semiconductor device.

In other words, the aforementioned related art metal plug structure of the semiconductor device and the method for forming the same have several problems.

As described above, with high integration of the semiconductor device, the contact hole for formation of the tungsten plug has a narrow size. For this reason, a critical dimension specification (diameter of the contact hole) of the upper width W1 and the lower width W2 of the tungsten plug becomes tight. As a result, problems occur in that contact resistance between the tungsten plug and a lower metal line layer is increased and an overlap margin between the tungsten plug and the metal line is reduced.

At this time, as shown in FIG. 3, to minimize contact resistance between the tungsten plug 41 and the lower metal line layer (not shown), the contact hole suitable for the lower width W2 may be formed. In this case, the upper width W1 becomes greater and thus is wider than the width of the metal line 50. The tungsten plug below the metal line is externally exposed during etching of the metal line. For this reason, the tungsten plug may be corroded. Also, the tungsten exposed outside the metal line may flow to its adjacent metal line causing a short.

Meanwhile, as shown in FIG. 4, if the contact hole suitable for the upper width W1 is formed considering the overlap margin between the tungsten plug 41 and the metal line, the lower width W2 becomes small increasing contact resistance between the tungsten plug 41 and the lower metal line layer.

As shown in FIG. 5, if the aspect ratio of the tungsten plug 41 is increased, the gate 20 adjacent to the tungsten plug 41 may be corroded due to an etching gas when the contact hole is formed. In this case, a thin film transistor comprised of the corroded gate fails to perform its function.

SUMMARY

Consistent with the present invention, there is provided a tungsten plug structure of a semiconductor device and a method for forming the same, which substantially obviate one or more problems due to limitations and disadvantages of the related art.

Consistent with the present invention there is provided a tungsten plug structure of a semiconductor device and a method for forming the same in which a tungsten plug process is performed at least twice to form a tungsten plug having a low aspect ratio, thereby obtaining an overlap margin between the tungsten plug and a metal line and minimizing contact resistance between the tungsten plug and a lower metal line layer.

Consistent with the invention, as embodied and broadly described herein, there is further provided a plug structure of a semiconductor device includes a silicon substrate in which various elements for the semiconductor device are formed, a first dielectric film formed on the silicon substrate, having a first contact hole, a first plug buried in the first contact hole of the first dielectric film, having a low aspect ratio, a second dielectric film formed on an entire surface including the first dielectric film, having a second contact hole on the first plug, a second plug buried in the second contact hole of the second dielectric film, having a low aspect ratio, and a metal line formed on the second plug.

In another aspect consistent with the present invention, a method is provided for forming a plug structure of a semiconductor device comprising forming a first dielectric film on a silicon substrate in which various elements for the semiconductor device are formed, forming a first plug by selectively patterning the first dielectric film to form a first contact hole and burying a conductive material in the first contact hole, forming a second dielectric film on an entire surface including the first dielectric film, forming a second plug by selectively patterning the second dielectric film to form a second contact hole on the first plug and burying a conductive material in the second contact hole, and forming a metal line on the second plug.

The metal line is electrically connected with a lower metal line layer on the silicon substrate by the first and second plugs. The first and second plugs are formed in such a manner that an upper width is greater than a lower width and the difference between the upper and lower widths is minimized to obtain a low aspect ratio.

In other words, a tungsten plug process is performed at least twice to form a tungsten plug having a low aspect ratio, thereby minimizing the difference in diameters (critical dimension) between the upper width and the lower width of the tungsten plug structure.

The second plug has an aspect ratio either the same as or lower than that of the first plug so as to obtain an overlap margin between the tungsten plug and the metal line and minimize contact resistance between the tungsten plug and the lower metal line layer.

It is to be understood that both the foregoing general description and the following detailed description are exemplary and explanatory and are intended to provide further explanation consistent with the invention as claimed.

BRIEF DESCRIPTION OF THE DRAWINGS

The accompanying drawings, which are included to provide a further understanding of the invention and are incorporated in and constitute a part of this application, illustrate embodiments consistent with the invention and together with the description serve to explain the principle of the invention. In the drawings.

DETAILED DESCRIPTION OF THE INVENTION

Reference will now be made in detail to the preferred embodiments consistent with the present invention, examples of which are illustrated in the accompanying drawings. Wherever possible, the same reference numbers will be used throughout the drawings to refer to the same or like parts.

Figure 1A:
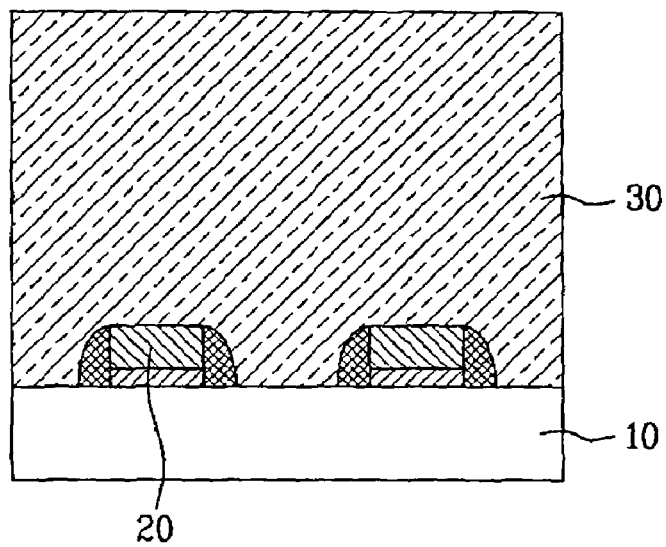
FIG. 1A to FIG. 1D are sectional views illustrating process steps of forming a tungsten plug of a semiconductor device according to the related art.
Figure 1B:
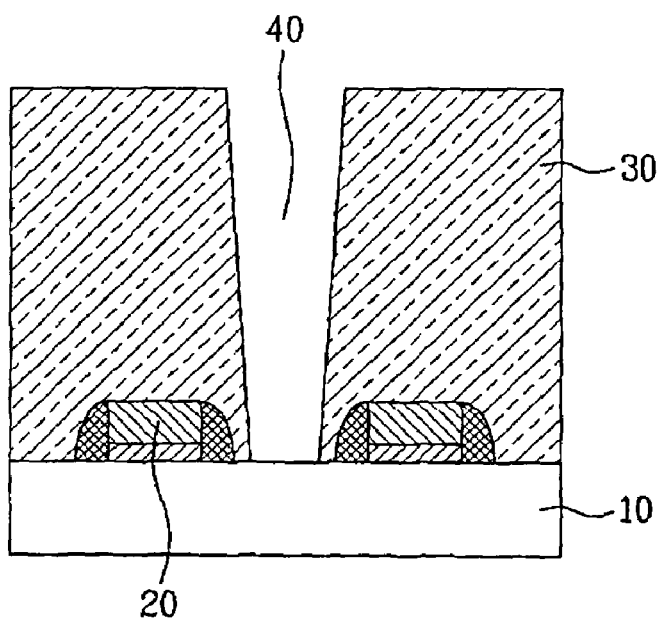
Figure 1C:
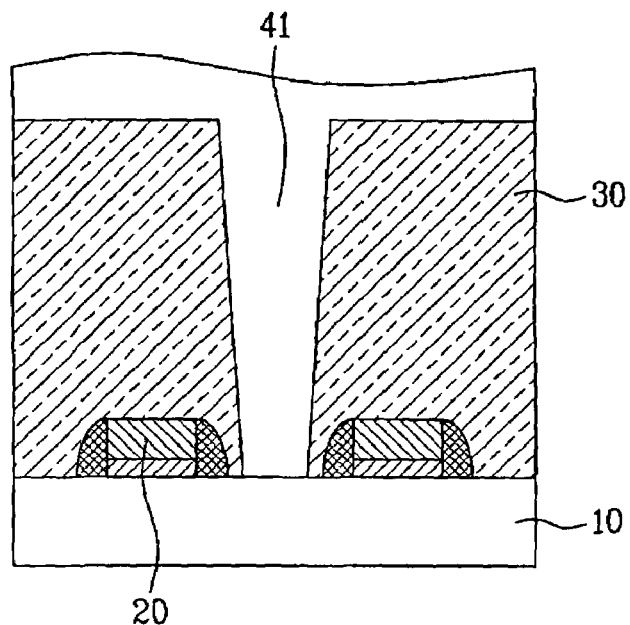
Figure 1D:
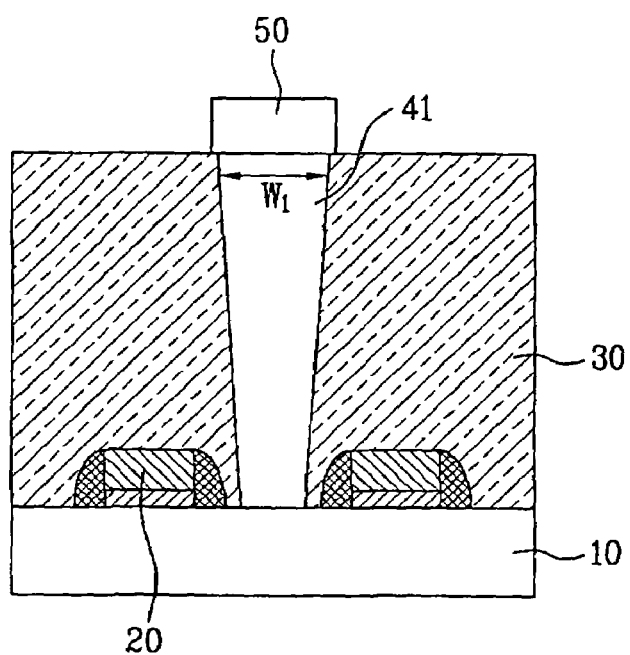
Figure 2:
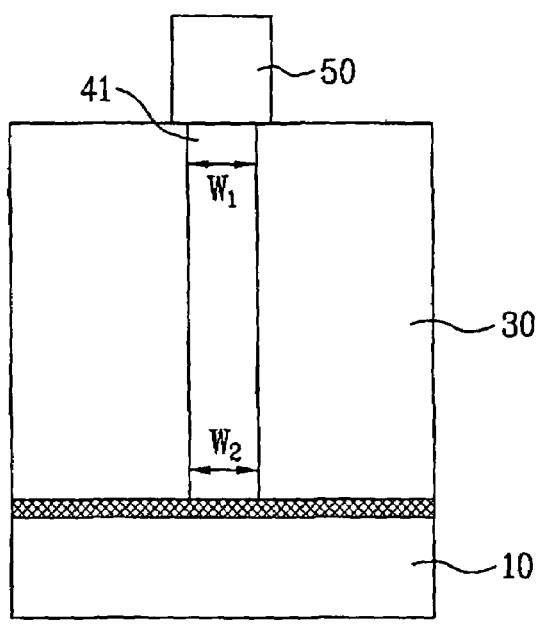
FIG. 2 is a sectional view illustrating a plug structure of a semiconductor device according to the related art.
Figure 3:
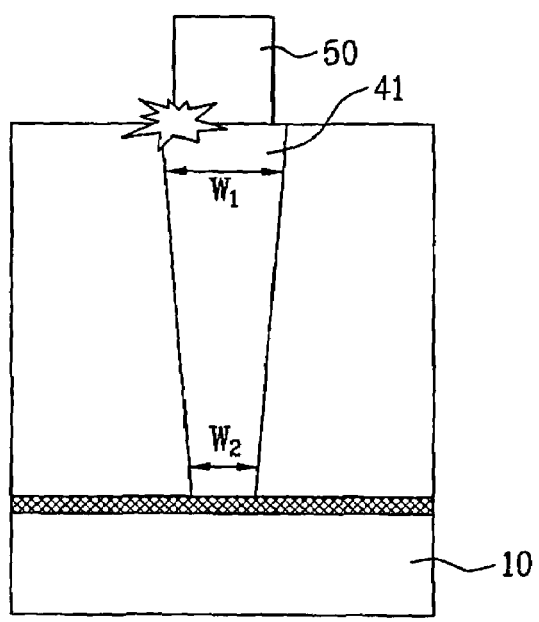
FIG. 3 to FIG. 5 are sectional views illustrating problems of a plug structure of a semiconductor device according to the related art.
Figure 4:
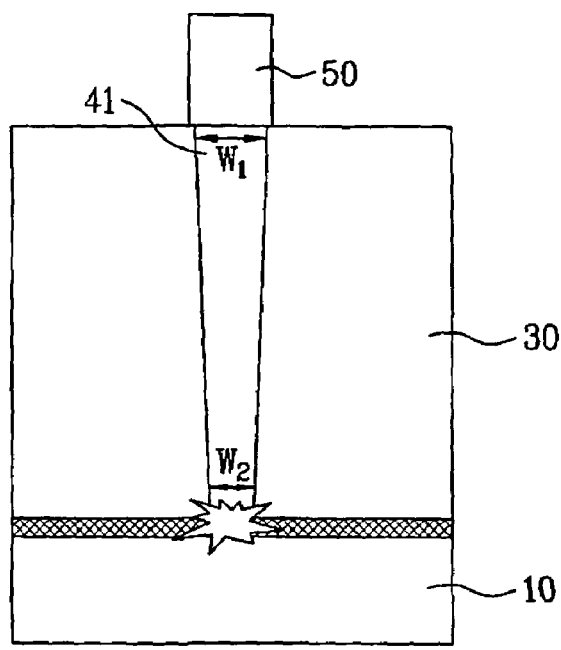
Figure 5:
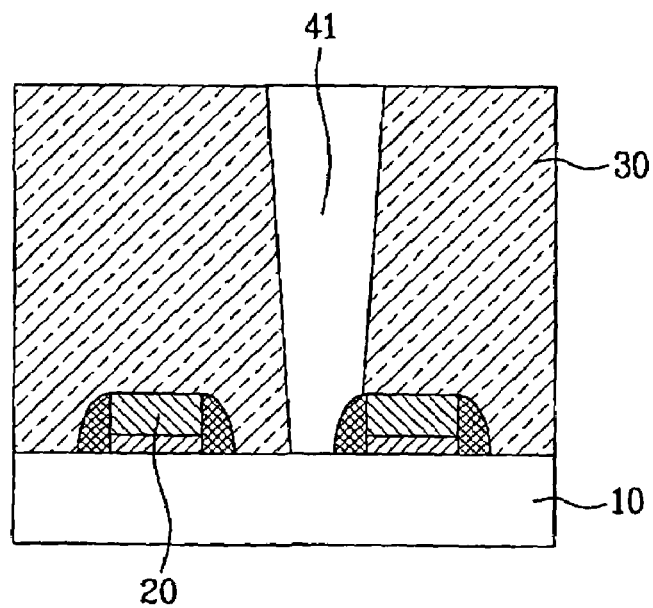
Figure 6:
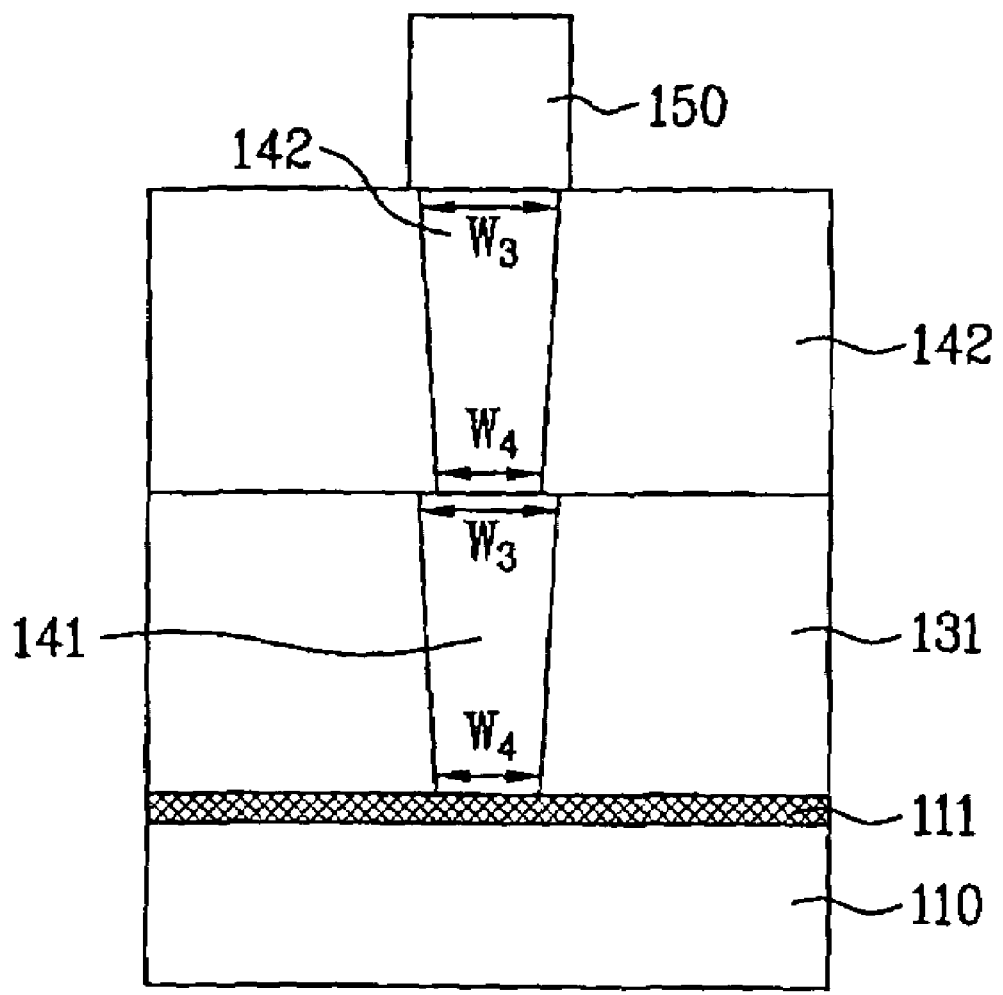
FIG. 6 is a sectional view illustrating a plug structure of a semiconductor device consistent with the present invention.

FIG. 6 is a sectional view illustrating a plug structure of a semiconductor device consistent with the present invention, and FIG. 7A to FIG. 7D are sectional views illustrating process steps of forming a metal line of a semiconductor device consistent with the present invention.

Hereinafter, a semiconductor substrate is one in which a metal line and a pad are to be formed.

A tungsten plug of a semiconductor device consistent with the present invention, as shown in FIG. 6, is provided with a silicon nitride film 111 formed on a silicon substrate 110 in which a transistor and various elements for the semiconductor device are formed. The silicon nitride film 111 serves as an etching stopper. A first dielectric film 131 is formed on the silicon nitride film 111. A first tungsten plug 141 is buried in the first dielectric film 131. A second dielectric film 132 is formed on the first dielectric film 131. A second tungsten plug 142 is buried in the second dielectric film 132. A metal line 150 is formed on the second dielectric film 132 overlapping the second tungsten plug 142. The metal line 150 contacts a lower metal line layer (not shown) through the first and second tungsten plugs 141 and 142. Aluminum may be used as the metal line 150.

The first tungsten plug 141 contacts the second tungsten plug 142. The sum of a height of the first tungsten plug and a height of the second tungsten plug is the same as a height of the related art tungsten plug. An upper width W3 of the first and second tungsten plugs 141 and 142 is greater than their lower width W4. However, since each height of the tungsten plugs is low, the difference in diameters between the upper width and the lower width is not great. In other words, it is possible to minimize the difference in diameters (critical dimension) of the tungsten plugs by depositing the first and second tungsten plugs at a low aspect ratio, that is, a low ratio of height to width.

The first and second tungsten plugs 141 and 142 may be provided with the same size as each other at the same position as each other. Preferably, the aspect ratio of the second tungsten plug that contacts the metal line is lower than that of the first tungsten plug. To form the first and second tungsten plugs with the same aspect ratio as each other, the first and second dielectric films 131 and 132 are formed of the same dielectric material as each other along with the same thickness as each other. To form the second tungsten plug having the aspect ratio lower than that of the first tungsten plug, the thickness of the second dielectric film is thinner than that of the first dielectric film.

As described above, if the tungsten plug having a low aspect ratio is formed, the whole aspect ratio of the tungsten plugs can be lowered. Therefore, a contact area between the tungsten plug and the lower metal line layer can sufficiently be obtained and the tungsten plug can be prevented from being exposed between portions of the metal line 150.

Meanwhile, rather than two tungsten plugs, three or more tungsten plugs may be deposited. In other words, a third dielectric film in which a third tungsten plug is buried is further formed on the second dielectric film. The second tungsten plug contacts the metal line through the third tungsten plug. Thus, the whole tungsten plug structure is formed in a deposition structure of the first, second and third tungsten plugs. In this case, the difference between upper and lower diameters (critical dimension) in the tungsten plug structure may be increasingly reduced.

The first, second and third tungsten plugs may be provided to be the same size as one another and at the same position as one another. Preferably, the aspect ratio of the third tungsten plug that contacts the metal line is lower than that of the first and second tungsten plugs. To form the first, second and third tungsten plugs with the same aspect ratio as one another, the first, second and third dielectric films are formed of the same dielectric material as one another along with the same thickness as one another. To form the third tungsten plug having the aspect ratio lower than that of the first and second tungsten plugs, the thickness of the third dielectric film is thinner than that of the first and second dielectric films.

As described above, if the tungsten plug that contacts the metal line is formed at a lower aspect ratio, an overlap margin between the tungsten plug and the metal line may sufficiently be obtained.

Hereinafter, a method for forming the tungsten plug will be described in detail.

Figure 7A:
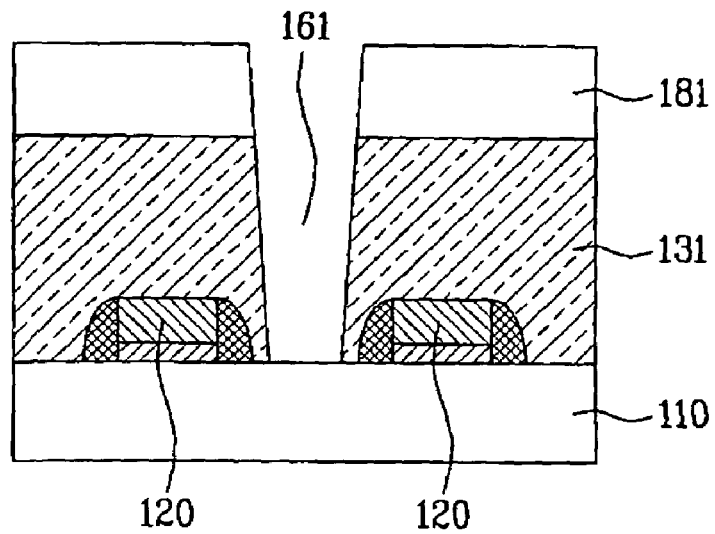
FIG. 7A to FIG. 7F are sectional views illustrating process steps of forming a metal line of a semiconductor device consistent with the present invention.

First, as shown in FIG. 7A, an interlayer dielectric film and a silicon nitride (SiN) film are sequentially deposited on an entire surface of the silicon substrate 110 including gate electrodes 120 and a lower metal line layer (not shown) formed on the silicon substrate 110 at a constant interval. BPSG, a high density plasma (HDP) oxide film, or $SiO_2$ is deposited on the silicon nitride film 111 by a CVD process and then planarized by a CMP process to form a first dielectric film 131. At this time, the first dielectric film 131 is thinner than the related art dielectric film. The silicon nitride film serves as an etching stopper.

Afterwards, a first photoresist pattern 181 is formed on the first dielectric film 131 to define a first contact hole 161. The first dielectric film 131 exposed between portions of the first photoresist pattern 181 is etched to form the first contact hole 161. The silicon nitride film is used as an end point when the first dielectric film 131 is etched. The silicon nitride film is also etched after the first dielectric film 131 is etched, so that the lower metal line layer is opened.

Figure 7B:
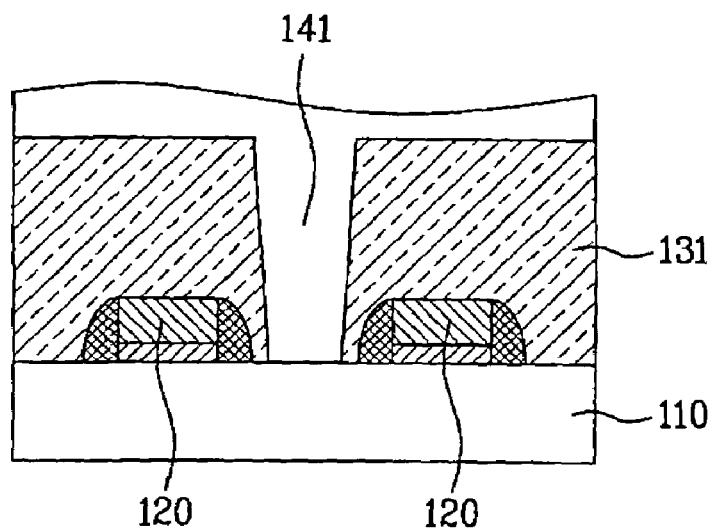

Subsequently, as shown in FIG. 7B, tungsten is deposited on the entire surface by the CVD process and buried in the first contact hole to form a first tungsten plug 141. At this time, a contact between the lower metal line layer and the first tungsten plug has a diameter of 0.16 μm or so.

WF6 is used as a reaction gas used when a tungsten conductive layer is deposited by the CVD process, and $H_2$ and $SiH_4$ are used as reduction gases. The pressure in a chamber may be in the range of 40 torr to 90 torr depending on equipment.

Afterwards, the tungsten on the first dielectric film 131 is completely removed by a CMP process to completely expose the first dielectric film 131. Thus, the first tungsten plug 141 is completed. At this time, since the thickness of the first dielectric film is thinner than that of the related art dielectric film, the aspect ratio of the first contact hole formed by partially etching the first dielectric film is low. Therefore, the aspect ratio of the first tungsten plug buried in the first contact hole may be also low. Also, since an upper surface of the first tungsten plug does not contact the metal line, the first tungsten plug should be formed so as not to increase contact resistance between the lower metal line layer and the first tungsten plug.

Figure 7C:
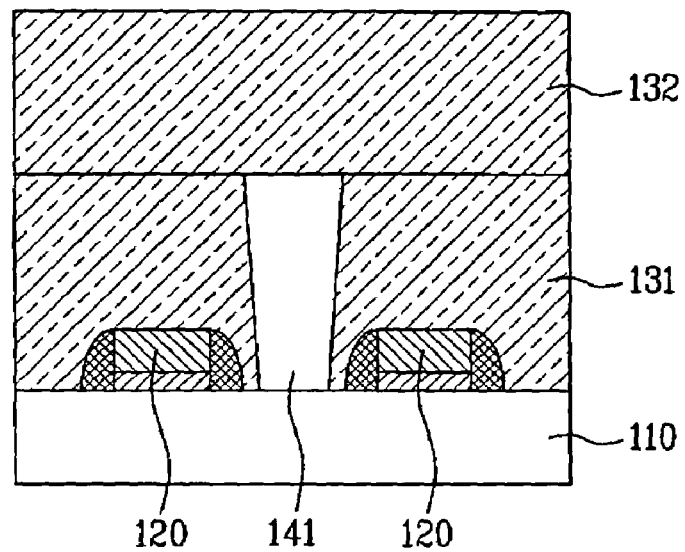

Next, as shown in FIG. 7C, BPSG, HDP oxide film or $SiO_2$ is deposited on the entire surface including the first dielectric film 131 by the CVD process and then planarized by the CMP process to form a second dielectric film 132. At this time, the second dielectric film is thinner than the related art dielectric film. The thickness of the first and second dielectric films combined may be the same as the thickness of the related art dielectric film.

Figure 7D:
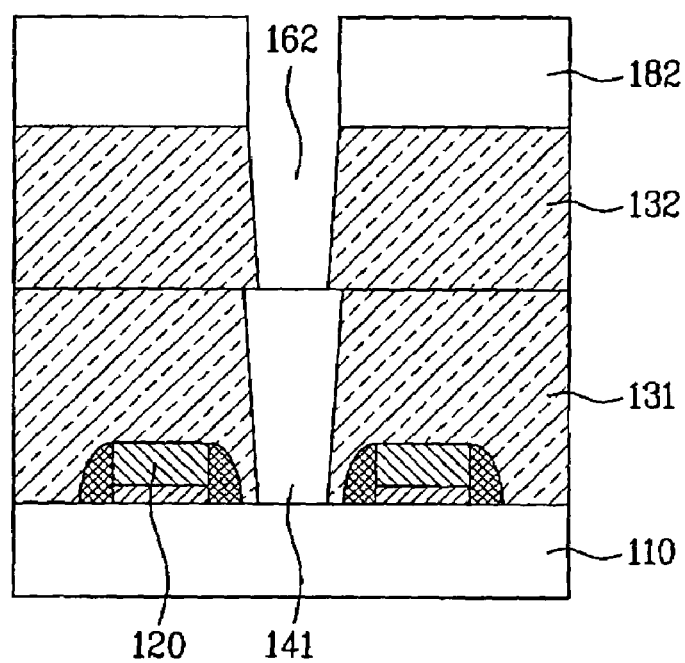

As shown in FIG. 7D, a second photoresist pattern 182 is formed on the second dielectric film 132 to define a second contact hole 162. The second dielectric film 132 exposed between portions of the second photoresist pattern 182 is etched to form the second contact hole 162 so that the first tungsten plug 141 is exposed to the outside. At this time, an exposure mask used for the second photoresist pattern 182 is the same as that for the first photoresist pattern 81.

Figure 7E:
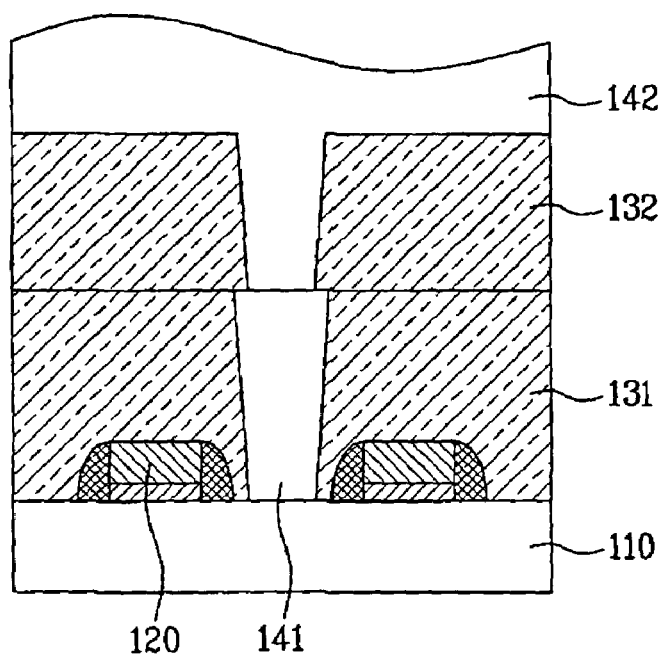

Subsequently, as shown in FIG. 7E, tungsten is deposited on the entire surface by the CVD process and buried in the second contact hole to form a second tungsten plug 142. At this time, a contact between a metal line layer to be formed later and the second tungsten plug has a diameter of 0.18 μm or so, and the metal line layer has a diameter of 0.20 μm or so. Thus, the second tungsten plug is not exposed outside the metal line layer. A method of depositing a tungsten conductive layer may be the same as above.

Figure 7F:
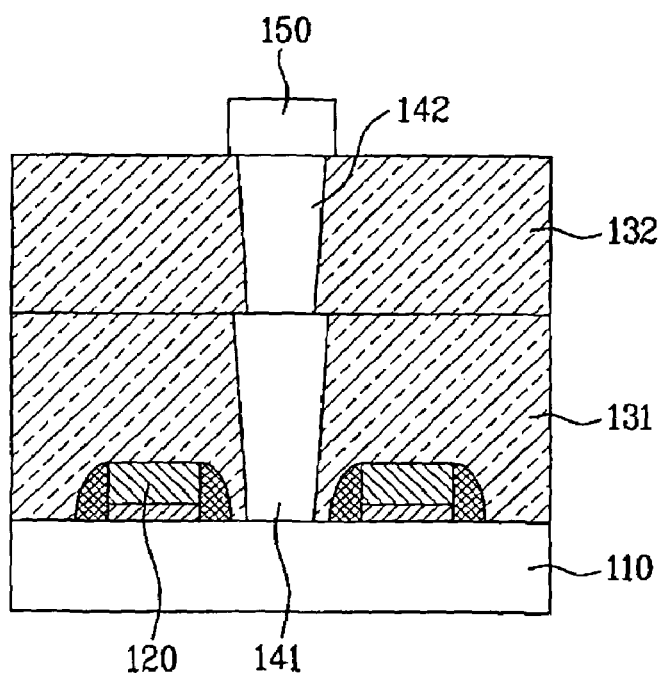

Afterwards, as shown in FIG. 7F, the tungsten on the upper surface of the second dielectric film 132 is completely removed by the CMP process to completely expose the second dielectric film 132. Thus, the second tungsten plug 142 is completed. At this time, since the thickness of the second dielectric film is thinner than that of the related art dielectric film, the aspect ratio of the second contact hole formed by partially etching the second dielectric film is low. Therefore, the aspect ratio of the second tungsten plug buried in the second contact hole is also low. The second tungsten plug should be formed considering an overlap margin so as not to expose the second tungsten plug outside the metal line layer to be formed later.

Finally, aluminum is deposited on the entire surface including the second tungsten plug 142 by sputtering and then patterned by a photolithographic process to form the metal line 150 that contacts the second tungsten plug 142. This aluminum line may have a thickness of, for example, 169 nm to 170 nm and may have a width of, for example, 0.20 μm. $Cl_2$, $O_2$, $BCl_3$, or Ar gas may be used as an etching gas to pattern the aluminum metal line. At this time, in addition to aluminum, another metal having excellent patterning characteristics may be used as the material for the metal line.

The lower metal line layer and the metal line are electrically connected with each other by the first and second tungsten plugs. Since the first and second tungsten plugs respectively have a low aspect ratio, it is possible to minimize the difference in critical dimension between the upper diameter width and the lower diameter width.

The first tungsten plug 141 contacts the second tungsten plug 142. The sum of the height of the first tungsten plug and the height of the second tungsten plug is the same as the height of the related art tungsten plug. The upper width W3 of the first and second tungsten plugs is greater than their lower width W4. However, since each height of the tungsten plugs is relatively short when compared to the prior art, the difference in diameters between the upper width and the lower width is not great. In other words, it is possible to minimize the difference in diameters (critical dimension) of the tungsten plugs by depositing the first and second tungsten plugs at a low aspect ratio.

The first and second tungsten plugs 141 and 142 may be the same size as each other and at the same position as each other. Preferably, the aspect ratio of the second tungsten plug that contacts the metal line is lower than that of the first tungsten plug. To form the first and second tungsten plugs with the same aspect ratio as each other, the first and second dielectric films 131 and 132 are formed of the same dielectric material as each other along with the same thickness as each other. To form the second tungsten plug having the aspect ratio lower than that of the first tungsten plug, the thickness of the second dielectric film is thinner than that of the first dielectric film.

As described above, if tungsten plugs having a low aspect ratio are formed, the aspect ratio of the tungsten plugs can be lowered. Therefore, the contact area between the tungsten plug and the lower metal line layer can sufficiently be obtained and the tungsten plug can be prevented from being exposed outside the metal line 150.

Meanwhile, in addition to two tungsten plugs, three or more tungsten plugs may be deposited to minimize the aspect ratio of each tungsten plug.

In other words, in the method for forming the tungsten plug structure, a third tungsten plug that electrically connects the second tungsten plug with the metal line may be formed between the step of forming the second tungsten plug and the step of forming the metal line.

Specifically, the method for forming the tungsten plug structure includes the steps of forming a third dielectric film on the entire surface including the second dielectric film in which the second tungsten plug is buried, selectively patterning the third dielectric film using a photolithographic process to form a third contact hole that exposes the second tungsten plug, forming the third tungsten plug by burying the tungsten in the third contact hole, and forming the metal line that contacts the third tungsten plug by depositing aluminum on the entire surface including the third tungsten plug using sputtering and patterning the aluminum using the photolithographic process.

The second tungsten plug contacts the metal line through the third tungsten plug. Thus, the tungsten plug structure is formed by the deposition of the first, second and third tungsten plugs. In this case, the difference between upper and lower diameters (critical dimension) of the tungsten plug structure may be increasingly reduced.

The first, second and third tungsten plugs may be provided at the same position as one another. Preferably, the first, second and third tungsten plugs are formed at the same aspect ratio as one another. Alternatively, the aspect ratio of the third tungsten plug that contacts the metal line may be lower than that of the first and second tungsten plugs. To form the first, second and third tungsten plugs with the same aspect ratio as one another, the first, second and third dielectric films are formed of the same dielectric material as one another along with the same thickness as one another. To form the third tungsten plug having the aspect ratio lower than that of the first and second tungsten plugs, the thickness of the third dielectric film is thinner than that of the first and second dielectric films.

In this way, if the tungsten plug that contacts the metal line is formed at a lower aspect ratio, the overlap margin between the tungsten plug and the metal line can sufficiently be obtained.

Consistent with the present invention, although a plug comprising tungsten has been described, a conductive material having burying characteristics poorer than that of tungsten may be used in a similar manner as described herein to form multilevel plugs.

As described above, the plug structure of a semiconductor device and the method for forming the same consistent with the present invention have the following advantages.

First, since two or more tungsten plugs are deposited at a low aspect ratio to electrically connect the lower metal line layer with the upper metal line layer, it is possible to reduce the difference in diameters (critical dimension) between the upper width and the lower width of the tungsten plug structure.

Second, since the upper tungsten plug has a lower aspect ratio than that of the lower tungsten plug, it is possible to obtain an overlap margin between the upper metal line layer and the tungsten plug. In other words, the lower tungsten plug can be formed based on the lower width considering the contact resistance with the lower metal line layer, and the upper tungsten plug can be formed based on the upper width considering the overlap margin with the upper metal line layer.

Finally, a conductive material having burying characteristics poorer than that of tungsten may be used in such a manner that multilevel plugs are formed. Therefore, it is possible to select a plurality of different conductive materials for the plug structure.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A semiconductor device comprising:
   a silicon substrate in which various elements for the semiconductor device are formed;
   a first dielectric film formed on the substrate, the first dielectric film having a first contact hole;
   a first plug having a low aspect ratio buried in the first contact hole;
   a second dielectric film formed on an entire surface of the first dielectric film, the second dielectric film having a second contact hole on the first plug;
   a second plug having a low aspect ratio buried in the second contact hole; and
   a metal line formed on the second plug,
   wherein the second plug has a height less than a height of the first plug such that the second plug has an aspect ratio less than that of the first plug.

2. The device of claim 1, wherein the first and second plugs are tungsten plugs.

3. The device of claim 1, wherein the first and second plugs are formed such that an upper width is greater than a lower width and the difference between the upper and lower widths is minimized.

4. The device of claim 1, wherein the metal line is an aluminum line.

5. The semiconductor device of claim 1, wherein the second dielectric film has a thickness less than that of the first dielectric film.

6. The semiconductor device of claim 1, wherein the first and second plugs are provided at the same position as each other.

7. The semiconductor device of claim 1, further comprising a third dielectric film and a third plug buried in the third dielectric film between the second plug and the metal line.

8. The semiconductor device of claim 7, wherein the third dielectric film has a thickness less than that of either the first dielectric film or the second dielectric film.

9. The semiconductor device of claim 7, wherein the third plug has an aspect ratio less than or equal to that of either the first plug or the second plug.

10. The semiconductor device of claim 7, wherein the first, second, and third plugs are provided at the same position as one another.

11. The semiconductor device of claim 7, wherein the third plug is a tungsten plug.

12. The semiconductor device of claim 7, wherein the third plug is formed such that an upper width is greater than a lower width and the difference between the upper and lower widths is minimized.

13. A method for forming a plug structure of a semiconductor device comprising:
   forming a silicon substrate;
   forming a plurality of device elements for the semiconductor device in the substrate;
   forming a first dielectric film on the substrate;
   forming a first plug by selectively patterning the first dielectric film to form a first contact hole and burying a conductive material in the first contact hole;
   forming a second dielectric film on an entire surface including the first dielectric film;
   forming a second plug by selectively patterning the second dielectric film to form a second contact hole on the first plug and burying a conductive material in the second contact hole; and
   forming a metal line on the second plug,
   wherein the second plug has a height less than a height of the first plug such that the second plug has an aspect ratio less than that of the first plug.

14. The method of claim 13, wherein the first and second plugs are formed of tungsten.

15. The method of claim 13, wherein the first and second plugs are formed at the same position as each other.

16. The method of claim 13, wherein the metal line is formed of aluminum.

17. The method of claim 13, wherein the second dielectric film is formed to have a thickness less than that of the first dielectric film.

18. The method of claim 13, further comprising:
   between the steps of forming the second plug and forming the metal line, forming a third dielectric film on the entire surface including the second plug, and forming a third plug by selectively patterning the third dielectric film to form a third contact hole on the second plug and burying a conductive material in the third contact hole.

19. The method of claim 18, wherein the third plug is formed of tungsten.

20. The method of claim 18, wherein the first, second and third plugs are formed at the same position as one another.

21. The method of claim 18, wherein the third dielectric film is formed at a thickness less than that of either the first dielectric film or the second dielectric film.

* * * * *